(12) United States Patent
Chen et al.

(10) Patent No.: US 9,831,205 B2
(45) Date of Patent: Nov. 28, 2017

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Jie Chen, New Taipei (TW); Ying-Ju Chen, Yunlin County (TW); Hsien-Wei Chen, Hsinchu (TW); Tsung-Yuan Yu, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/082,714

(22) Filed: Nov. 18, 2013

(65) Prior Publication Data
US 2015/0137349 A1    May 21, 2015

(51) Int. Cl.
*H01L 23/48* (2006.01)
*H01L 23/00* (2006.01)

(52) U.S. Cl.
CPC .............. *H01L 24/17* (2013.01); *H01L 24/05* (2013.01); *H01L 24/06* (2013.01); *H01L 24/03* (2013.01); *H01L 24/13* (2013.01); *H01L 24/16* (2013.01); *H01L 24/81* (2013.01); *H01L 24/94* (2013.01); *H01L 2224/0345* (2013.01); *H01L 2224/03462* (2013.01); *H01L 2224/0401* (2013.01); *H01L 2224/0557* (2013.01); *H01L 2224/05555* (2013.01); *H01L 2224/05567* (2013.01); *H01L 2224/05569* (2013.01);
(Continued)

(58) Field of Classification Search
CPC ...... H05K 3/3452; H05K 3/3436; H05K 1/18; H05K 1/111; H05K 2201/094
USPC ......................................... 257/737
See application file for complete search history.

(56) References Cited

U.S. PATENT DOCUMENTS 6,274,474 B1 * 8/2001 Caletka et al. ............... 438/613
6,787,918 B1 * 9/2004 Tsai et al. ..................... 257/778
(Continued)

FOREIGN PATENT DOCUMENTS

JP      2007-81374      *   3/2007
KR      1020060093382 A     8/2006

OTHER PUBLICATIONS

Notice of allowance and its english translation of the corresponding Korean application 10-2014-0159050 from KIPO dated Aug. 22, 2016.
(Continued)

*Primary Examiner* — A. Sefer
(74) *Attorney, Agent, or Firm* — WPAT, P.C., Intellectual Property Attorneys; Anthony King; Kay Yang

(57) ABSTRACT

A semiconductor device includes a substrate including a surface, a plurality of pads disposing on the surface of the substrate, the plurality of pads includes a non-solder mask defined (NSMD) pad and a solder mask defined (SMD) pad, and the NSMD pad is arranged at a predetermined location. Further, a method of manufacturing a semiconductor device includes providing a substrate, disposing a plurality of pads on a surface of the substrate, disposing a solder mask over the surface of the substrate and the plurality of pads, forming a first recess in the solder mask to surround one of the plurality of pads, and forming a second recess in the solder mask and above one of the plurality of pads.

20 Claims, 17 Drawing Sheets

(52) U.S. Cl.
CPC ............... *H01L 2224/05571* (2013.01); *H01L 2224/05572* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05684* (2013.01); *H01L 2224/061* (2013.01); *H01L 2224/0603* (2013.01); *H01L 2224/06131* (2013.01); *H01L 2224/06133* (2013.01); *H01L 2224/06134* (2013.01); *H01L 2224/06177* (2013.01); *H01L 2224/06179* (2013.01); *H01L 2224/06515* (2013.01); *H01L 2224/131* (2013.01); *H01L 2224/13111* (2013.01); *H01L 2224/13116* (2013.01); *H01L 2224/13147* (2013.01); *H01L 2224/16145* (2013.01); *H01L 2224/16227* (2013.01); *H01L 2224/17051* (2013.01); *H01L 2224/81191* (2013.01); *H01L 2224/81815* (2013.01); *H01L 2224/94* (2013.01); *H01L 2924/351* (2013.01); *H01L 2924/3511* (2013.01); *H01L 2924/3512* (2013.01); *H01L 2924/35121* (2013.01); *H01L 2924/381* (2013.01)

(56) References Cited

U.S. PATENT DOCUMENTS

| | | | |
|---|---|---|---|
| 2001/0000925 A1* | 5/2001 | Caletka et al. | 257/738 |
| 2002/0070451 A1* | 6/2002 | Burnette et al. | 257/737 |
| 2007/0096338 A1* | 5/2007 | Kim et al. | 257/780 |
| 2013/0107483 A1* | 5/2013 | Jiang | H05K 1/18 |
| | | | 361/767 |
| 2013/0299970 A1 | 11/2013 | Harada et al. | |
| 2014/0376202 A1* | 12/2014 | Shibutani | 361/767 |

OTHER PUBLICATIONS

English translation of KR1020060093382.
Office action of the corresponding Chinese application 201410377149.1 from SIPO dated Jun. 12, 2017.

* cited by examiner

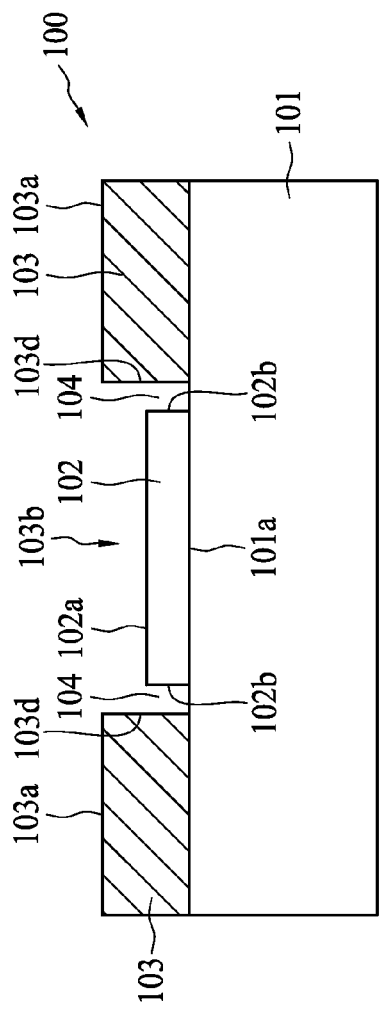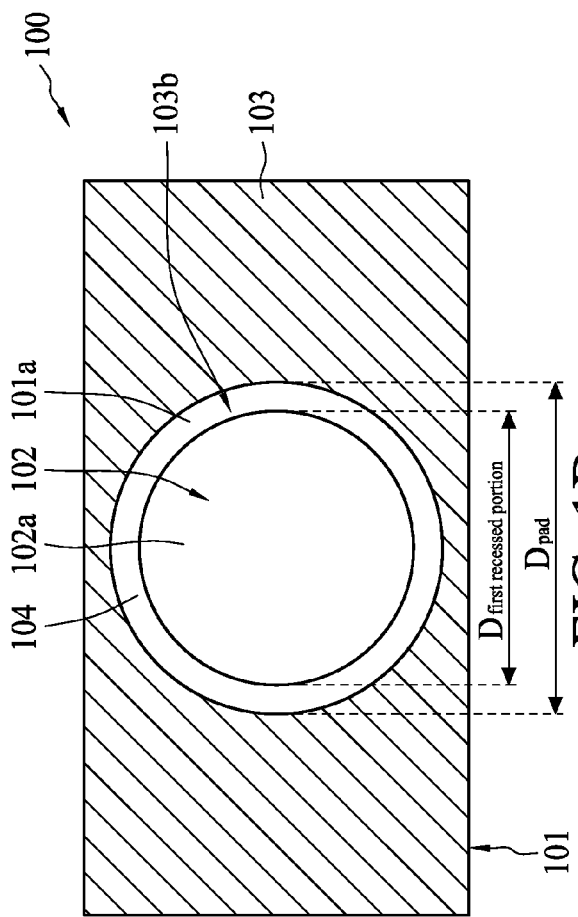
FIG. 1A
FIG. 1B

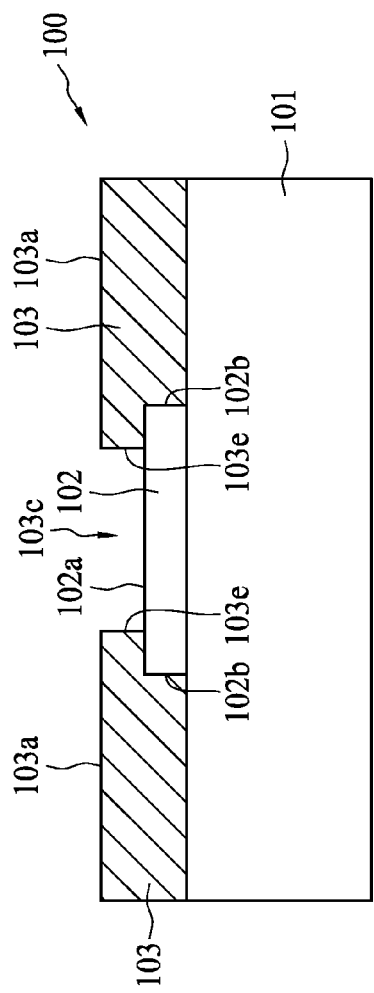
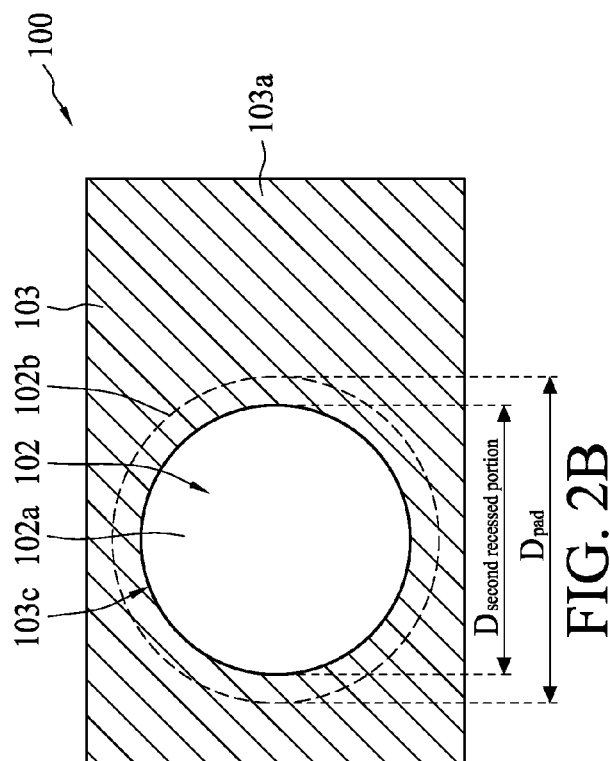
FIG. 2A
FIG. 2B

SEMICONDUCTOR DEVICE AND MANUFACTURING METHOD THEREOF

FIELD

The disclosure relates to a semiconductor device and a method of manufacturing a semiconductor device.

BACKGROUND

Electronic equipments involving numbers of semiconductor devices are indispensable from our daily life. With the advancement of electronic technology, the electronic equipment has becomes smaller in size and has to execute and perform more and more complicated and multiple functions. Thus, the electronic equipment becomes more compact involving more numbers of electronic components, and becomes more complex in structure involving high density of input/output (I/O) terminals within such a small area.

A wafer level packaging (WLP) technology has been gaining in popularity. This technology provides a wafer level manufacturing of the semiconductor device with high functions and performances while small size of the semiconductor device. During manufacturing of the semiconductor device, a surface mounting technology (SMT) is employed for miniaturizing the semiconductor device. The semiconductor device includes a substrate mounting on another substrate, so that a pad of the substrate is bonded and electrically connected with a pad of another substrate through a solder ball.

The pads of the substrate are formed on a top surface of the substrate by various methods. However, the pads formed by different methods would provide different reliability with respect to drop test, thermal cycling, bending or etc. For example, some pads would be able to withstand a high stress level and thus cracks would not be developed easily, while some pads would be able to withstand a high temperature and thus delamination from the substrate is minimized.

As such, there is a continuous demand on improving the configuration of the pads on the substrate and manufacturing operations of the pads to optimize reliability of the pads and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1A is a schematic view of a semiconductor device with a non-solder mask defined (NSMD) pad in accordance with some embodiments of the present disclosure.

FIG. 1B is a top view of a semiconductor device with a NSMD pad in accordance with some embodiments of the present disclosure.

FIG. 2A is a schematic view of a semiconductor device with a solder mask defined (SMD) pad in accordance with some embodiments of the present disclosure.

FIG. 2B is a top view of a semiconductor device with a SMD pad in accordance with some embodiments of the present disclosure.

DETAILED DESCRIPTION OF THE INVENTION

Figure 3A:
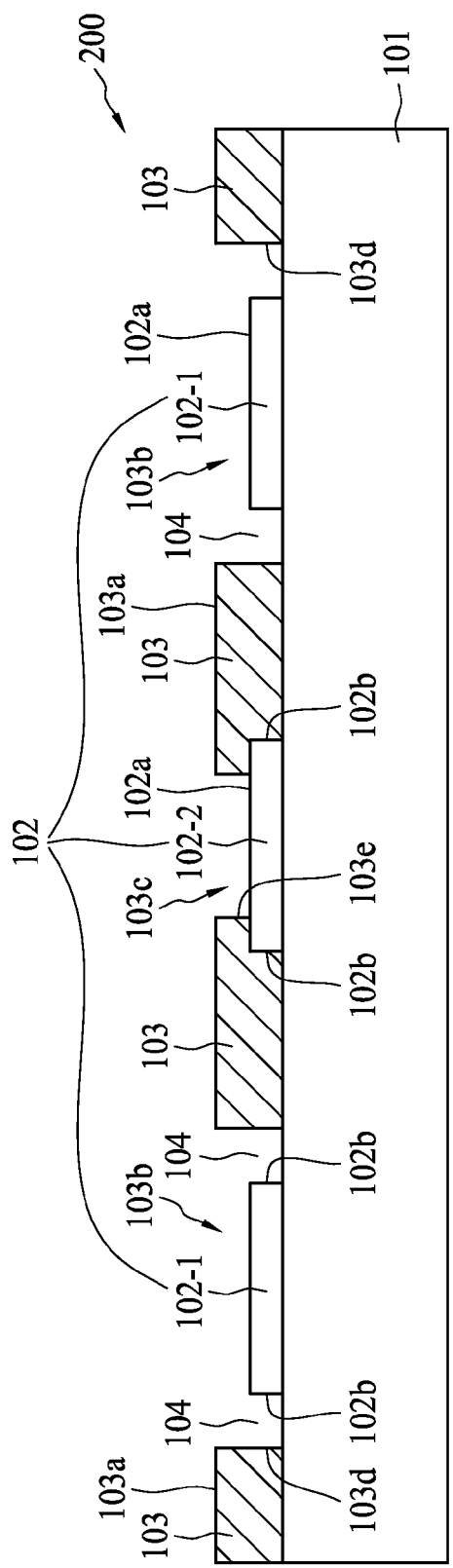
FIG. 3A is a schematic view of a semiconductor device with a NSMD pad and a SMD pad in accordance with some embodiments of the present disclosure.

In the surface mount technology (SMT), the semiconductor device includes at least two substrates. One of the substrates is stacked on another one of the substrates by attaching a pad of the substrate with a pad of another substrate through a conductive bump such as a solder joint or a solder bump. The pad of the substrate is formed by sputtering or electroplating a conductive material on the substrate, so that the pad conducts an electricity between a circuitry of the substrate and a circuitry of another substrate external to the substrate. The pad of the substrate is then covered by a soldering material in order to selectively expose a top surface of the pad. The pad could be exposed by various methods which define an area on the top surface of the pad for receiving the bump. The exposed surface of the pad is then attached with the bump.

However, the above configuration of the pad on the substrate have some issues such as reduction of adhesion between the pad and the substrate, poor performance in mechanical testing such as board bending or drop test, stress concentration on a periphery of the pad, poor reliability in a board level temperature cycling, etc. As the pad formed and exposed by different methods would have different issues, ultimately the substrate would overall have low reliability and poor functional performance.

The manufacturing and use of the embodiments of the present invention are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

In the present disclosure, a semiconductor device with an improved configuration is disclosed. The semiconductor device includes a substrate and several pads on the substrate which are in a combination of solder mask defined (SMD) pads and non-solder mask defined (NSMD) pads, such that disadvantages of the SMD pads and the NSMD pads are offset and thus the substrate as a whole possesses advantages contributed from the SMD pads and the NSMD pads, such as high reliability with respect to the board level temperature cycle, good performance in drop test, reduction in number of stress concentration point, etc.

FIG. 1A is an embodiment of a semiconductor device 100. The semiconductor device 100 includes a substrate 101. In some embodiments, the substrate 101 is a circuit board including a silicon substrate for carrying a circuitry within the silicon substrate and supporting several semiconductor components connected to the circuitry. The silicon substrate includes several conductive layers and several dielectric layers. The conductive layers includes some conductive traces for electrically connecting several semiconductor components on the silicon substrate. The dielectric layers are configured for insulation between the conductive traces. In some embodiments, the circuit board is a printed circuit board (PCB) including some integrated circuits (IC) for electrical connection of the semiconductor components thereon. In some embodiments, the substrate 101 is in a strip shape.

In some embodiments, the semiconductor device 100 includes a pad 102 disposed on a surface 101a of the substrate 101. The pad 102 is extended horizontally along the surface 101a. In some embodiments, the pad 102 is an under bump metallurgy (UBM) pad for receiving a conductive bump including copper, tin, lead or etc. The UBM pad is a solderable surface which is exposed for receiving the bump and electrically connecting the pad 102 with a circuitry internal to the substrate 101. The pad 102 is bonded with the bump after heat treatment such as reflow.

In some embodiments, the pad 102 is disposed on the surface 101a by various methods such as electroplating, sputtering, etc. In some embodiments, the pad 102 includes a conductive material such as gold, silver, copper, nickel, tungsten, aluminum, and/or alloys thereof.

In some embodiments, the semiconductor device 100 includes a solder mask 103 disposed over the surface 101a of the substrate 101. In some embodiments, the solder mask 103 is spaced from the pad 102. The solder mask 103 surrounds the pad 102. There is a gap 104 between the solder mask 103 and the pad 102. The solder mask 103 is not contacted with the pad 102 and is not covered the pad. In some embodiments, a top surface 103a of the solder mask 103 is at a level above a top surface 102a of the pad 102.

In some embodiments, the solder mask 103 includes a polymeric material such as liquid epoxy, polyepoxide or etc. In some embodiments, the solder mask 103 is disposed on the surface 101a of the substrate 101 by silk screening, spraying, etc.

In some embodiments, the solder mask 103 includes a first recessed portion 103b. The first recessed portion 103b surrounds the pad 102, that the pad 102 is disposed within the first recessed portion 103b of the solder mask 103. In some embodiments, the first recessed portion 103b is extended from the top surface 103a of the solder mask 103 to the top surface 101a of the substrate 101.

In some embodiments, a sidewall of the first recessed portion 103b is disposed away from the pad 102. In some embodiments, the first recessed portion 103b is configured for exposing the top surface 102a and a peripheral portion 102b of the pad 102 to receive a bump.

In some embodiments, the pad 102 is a non-solder mask defined (NSMD) pad. The NSMD pad 102 is disposed within the first recessed portion 103b and is spaced from the solder mask 103. The NSMD pad 102 is isolated from the solder mask 103. The top surface 102a and the peripheral portion 102b of the pad 102 are not covered by the solder mask 103. The top surface 102a of the NSMD pad 102 is absent from the solder mask 103. An area of the NSMD pad 102 for receiving the bump is not dependent on a size of the first recessed portion 103b. The first recessed portion 103b is larger than the NSMD pad 102.

FIG. 1B is a top view of an embodiment of a semiconductor device 100 as in FIG. 1A. The semiconductor device 100 includes a substrate 101, a pad 102 and a solder mask 103. In some embodiments, the solder mask 103 substantially covers a top surface 101a of a substrate 101. The solder mask 103 includes a first recessed portion 103b surrounding the pad 102, so that the solder mask 103 is spaced from the pad 102. In some embodiments, there is an annular gap 104 between the pad 102 and the solder mask 103. The annular gap 104 surrounds the pad 102.

In some embodiments, the first recessed portion 103b is in a circular or an elliptical shape, and the pad 102 is also in a circular or an elliptical shape. In some embodiments, the first recessed portion 103b has a width or diameter $D_{first\ recessed\ portion}$, and the pad 102 has a width or diameter $D_{pad}$. In some embodiments, the diameter $D_{first\ recessed\ portion}$ of the first recessed portion 103b is larger than the diameter $D_{pad}$ of the pad 102. In some embodiments, the diameter $D_{first\ recessed\ portion}$ of the first recessed portion 103b is about 300 um to about 350 um. In some embodiments, the diameter $D_{pad}$ of the pad 102 is about 200 um to 300 um.

FIG. 2A is an embodiment of a semiconductor device 100. The semiconductor device 100 includes a substrate 101. In some embodiments, the substrate 101 is a printed circuit board (PCB) including some integrated circuits (IC) for electrical connection of the semiconductor components thereon. In some embodiments, the substrate 101 is in a strip shape.

In some embodiments, the semiconductor device 100 includes a pad 102 disposed on a surface 101a of the substrate 101. The pad 102 is extended horizontally along the surface 101a. In some embodiments, the pad 102 is a UBM pad for receiving a conductive bump including copper, tin, lead, solder or etc. The UBM pad is configured for electrically connecting the pad 102 with a circuitry internal to the substrate 101. In some embodiments, the pad 102 is disposed on the surface 101a by electroplating. In some embodiments, the pad 102 includes a conductive material such as gold, silver, copper, nickel, tungsten, aluminum, and/or alloys thereof.

In some embodiments, the semiconductor device 100 includes a solder mask 103 disposed over the surface 101a of the substrate 101. In some embodiments, the solder mask 103 includes a polymeric material such as liquid epoxy, polyepoxide or etc. In some embodiments, the solder mask 103 surrounds the pad 102. In some embodiments, the solder mask 103 partially covers the pad 102. An end portion of a top surface 102a and a peripheral portion 102b of the pad 102 are covered by the solder mask 103. The solder mask 103 is contacted with the pad 102.

In some embodiments, a central part of the top surface 102a is exposed for receiving a bump. In some embodiments, a top surface 103a of the solder mask 103 is at a level above the top surface 102a of the pad 102 and over the pad 102.

In some embodiments, the solder mask 103 includes a second recessed portion 103c. In some embodiments, the second recessed portion 103c is above the pad 102. The pad 102 is disposed underneath the second recessed portion 103c. In some embodiments, the second recessed portion 103c is extended from the top surface 103a of the solder mask 103 to the top surface 102a of the pad 102. A bottom of the second recessed portion 103c is interfaced to the top surface 102a.

In some embodiments, a sidewall 103e of the second recessed portion 103c is disposed on the top surface 102a of the pad 102. In some embodiments, the second recessed portion 103c is configured for exposing the central part of the top surface 102a of the pad 102 to receive a bump.

In some embodiments, the pad 102 is a solder mask defined (SMD) pad. The SMD pad 102 is partially covered by the solder mask 103. A periphery of the SMD pad is surrounded by the solder mask 103, so that the central part of the top surface 102a of the SMD pad 102 for receiving the bump is defined by the solder mask 103. The central part of the top surface 102a of the SMD pad 102 is exposed depending on a size of the second recessed portion 103c. In some embodiments, the second recessed portion 103c is smaller than the SMD pad 102.

FIG. 2B is a top view of an embodiment of a semiconductor device 100 as in FIG. 2A. The semiconductor device 100 includes a substrate 101, a pad 102 and a solder mask 103. In some embodiments, the solder mask 103 covers a top surface 101a of a substrate 101 and a peripheral portion 102b of the pad 102. The solder mask 103 includes a second recessed portion 103c disposed above the pad 102. In some embodiments, the peripheral portion 102b of the pad 102 is circumferentially surrounded by the solder mask 103.

In some embodiments, the second recessed portion 103c is in a circular or an elliptical shape, and the pad 102 is also in a circular or an elliptical shape. In some embodiments, the second recessed portion 103c has a width or diameter $D_{second\ recessed\ portion}$, and the pad 102 has a width or diameter $D_{pad}$. In some embodiments, the diameter $D_{second\ recessed\ portion}$ of the second recessed portion 103c is smaller than the diameter $D_{pad}$ of the pad 102. In some embodiments, the diameter $D_{second\ recessed\ portion}$ of the second recessed portion 103c is about 175 um to about 250 um. In some embodiments, the diameter $D_{pad}$ of the pad 102 is about 250 um to 350 um.

FIG. 3A is an embodiment of a semiconductor device 200. The semiconductor device 200 includes a substrate 101, a solder mask 103 and several pads 102 disposed on the top surface 101a of the substrate 101. In some embodiments, the pads 102 includes several NSMD pads 102-1 and several SMD pads 102-2. The NSMD pad 102-1 has similar configuration as in FIGS. 1A and 1B. The SMD pad 102-2 has similar configuration as in FIGS. 2A and 2B. In some embodiments, the solder mask 103 covers a peripheral portion 102b of the SMD pad 102-2, while spaces away from the NSMD pad 102-1.

In some embodiments, the solder mask 103 includes several first recessed portions 103b and several second recessed portions 103c. The NSMD pad 102-1 is within the first recessed portion 103b, and the SMD pad 102-2 is disposed underneath the second recessed portion 103c.

Figure 3B:
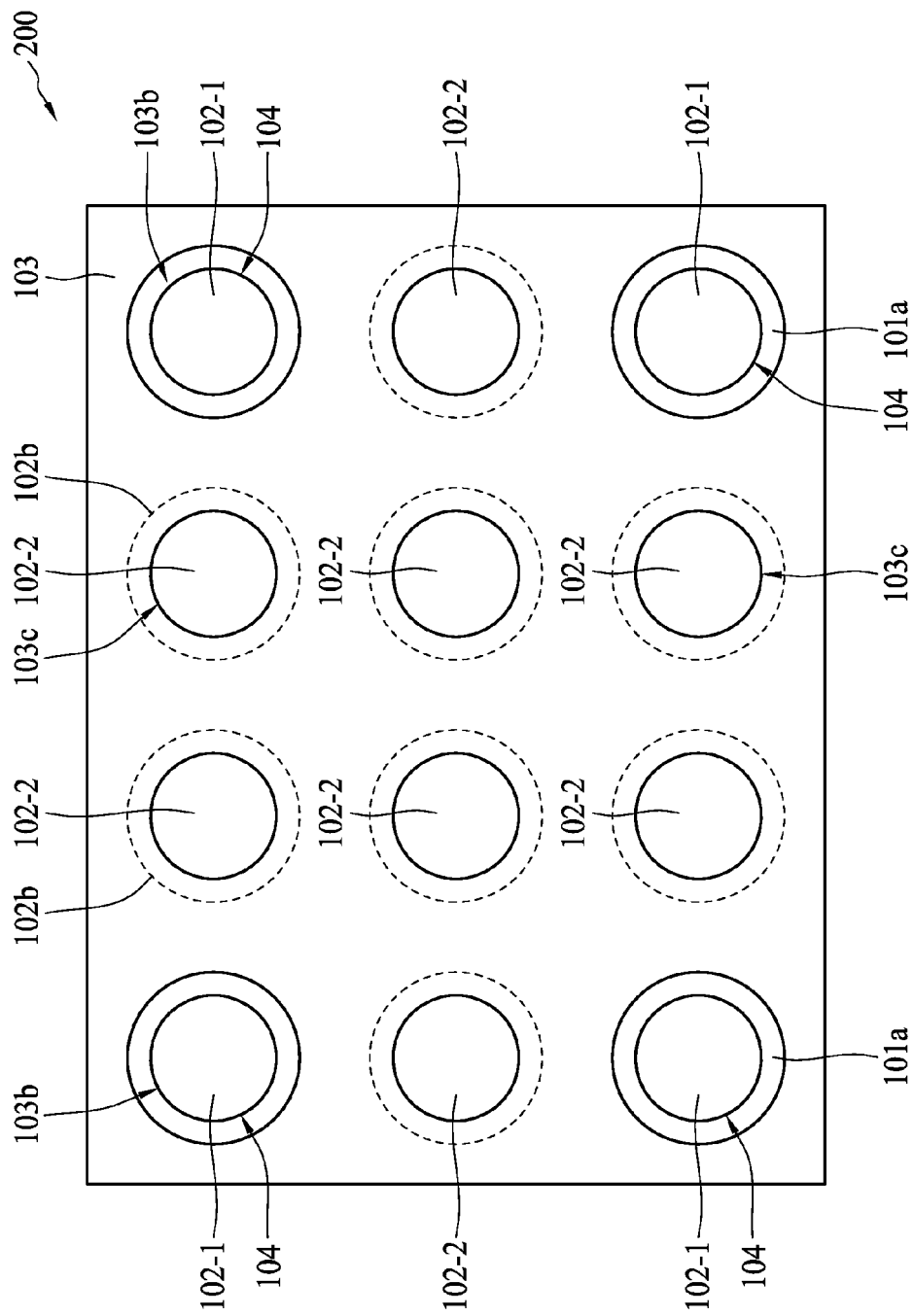
FIG. 3B is a top view of a semiconductor device with a NSMD pad and a SMD pad in accordance with some embodiments of the present disclosure.

FIG. 3B is a top view of an embodiment of a semiconductor device 200 as in FIG. 3A. The semiconductor device 200 includes a substrate 101, several NSMD pads 102-1, several SMD pads 102-2 and a solder mask 103 disposed over the top surface 101a. In some embodiments, the solder mask 103 includes several first recessed portions 103b and several second recessed portions 103c, so that the NSMD pad 102-1 is spaced from the solder mask 103 in a annular gap 104 and a peripheral portion 102b of the SMD pad 102-2 is circumferentially covered by the solder mask 103.

Figure 4A:
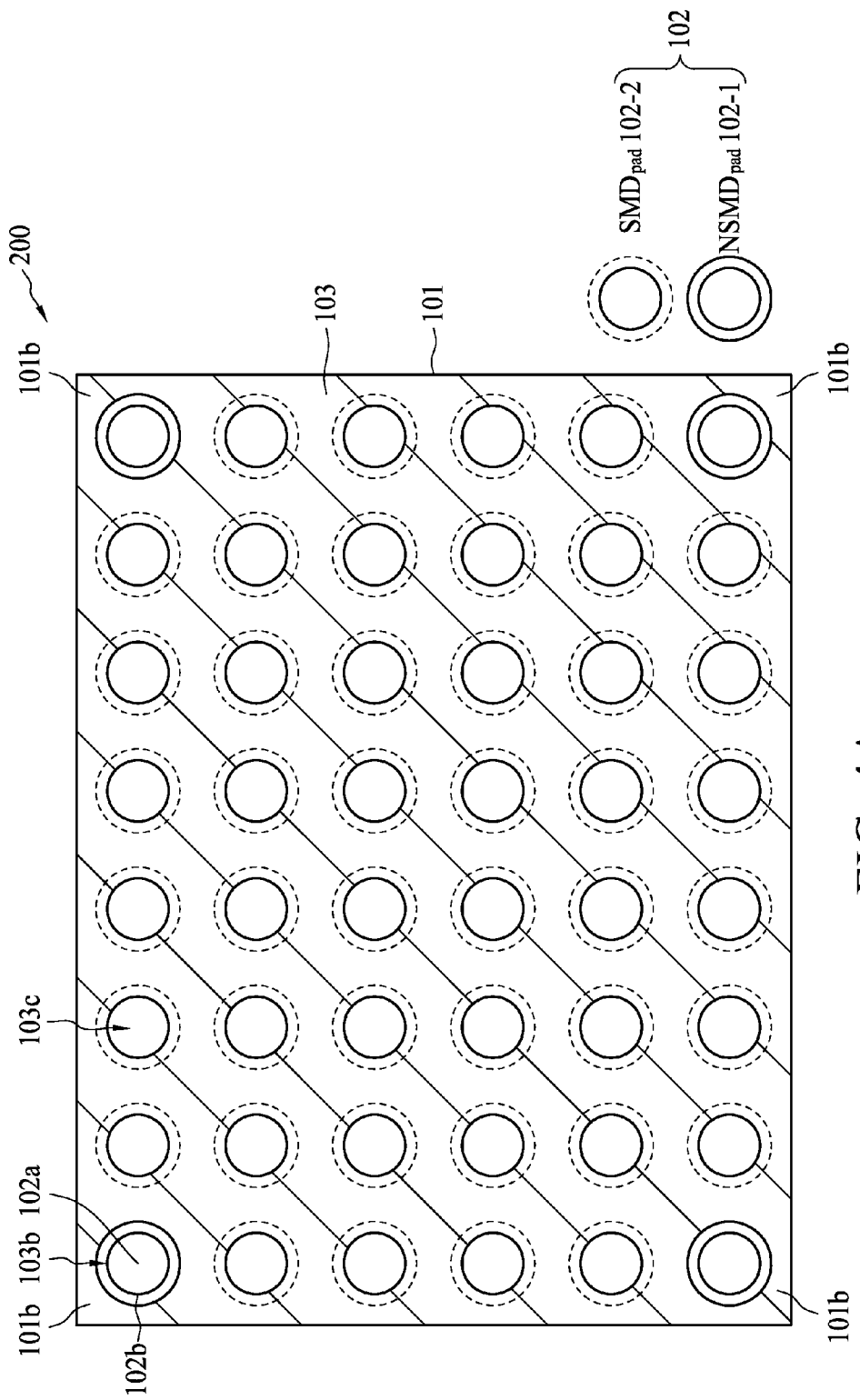
FIG. 4A is a top view of a semiconductor device with a NSMD pad at a corner in accordance with some embodiments of the present disclosure.

FIG. 4A is an embodiment of a semiconductor device 200. The semiconductor device 200 includes a substrate 101, a solder mask 103 on the substrate, several NSMD pads 102-1 and several SMD pads 102-2 disposed on the substrate 101. In some embodiments, the SMD pad 102-2 is disposed away from the corner 101b of the substrate 101. In some embodiments, the SMD pad 102-2 is disposed at a central portion of the substrate 101.

In some embodiments, the NSMD pads 102-1 and the SMD pads 102-2 are arranged in a regular array. The NSMD pads 102-1 and the SMD pads 102-2 are disposed in several horizontal rows and several vertical columns on the substrate 101.

In some embodiments, the NSMD pad 102-1 is arranged at a predetermined location. In some embodiments, the predetermined location is at a corner 101b of the substrate 101. The NSMD pad 102-1 is configured for receiving a bump which could electrically connects with a pad on another substrate.

In some embodiments, the NSMD pad 102-1 is arranged at the corner 101b because the NSMD pad 102-1 allows the bump disposing on a top surface 102a as well as a peripheral portion 102b of the NSMD pad 102-1, so as to minimize or even prevent a development of stress concentration point around the solder mask 103. As such, disposition of the NSMD pad 102-1 at the corner 101b of the substrate 101 provides an improved reliability of the substrate 101 with respect to drop test, board level temperature cycle, board bending, etc and minimize development of cracking and delamination of components.

In some embodiments, the solder mask 103 includes several first recessed portions 103b and several second recessed portions 103c. In some embodiments, the first recessed portion 103b surrounds the NSMD pad 102-1, and the second recessed portion 103c is disposed above the SMD pad 102-2.

In some embodiments, the first recessed portion 103b is disposed at the predetermined location in accordance with a position of a corresponding NSMD pad 102-1. In some embodiments, the first recessed portion 103b is disposed at the corner 101b of the substrate 101 because the NSMD pad 102-1 is also disposed at the corner 101b. The position of the first recessed portion 103b corresponds to the position of the corresponding NSMD pad 102-1.

In some embodiments, the second recessed portion 103c is disposed at a position corresponding to a position of the SMD pad 102-2. In some embodiments, the second recessed portion 103c is disposed at the central portion of the substrate 101 because the corresponding SMD pad 102-2 is also disposed at the central portion. The position of the second recessed portion 103c corresponds to the position of the corresponding SMD pad 102-2.

Figure 4B:
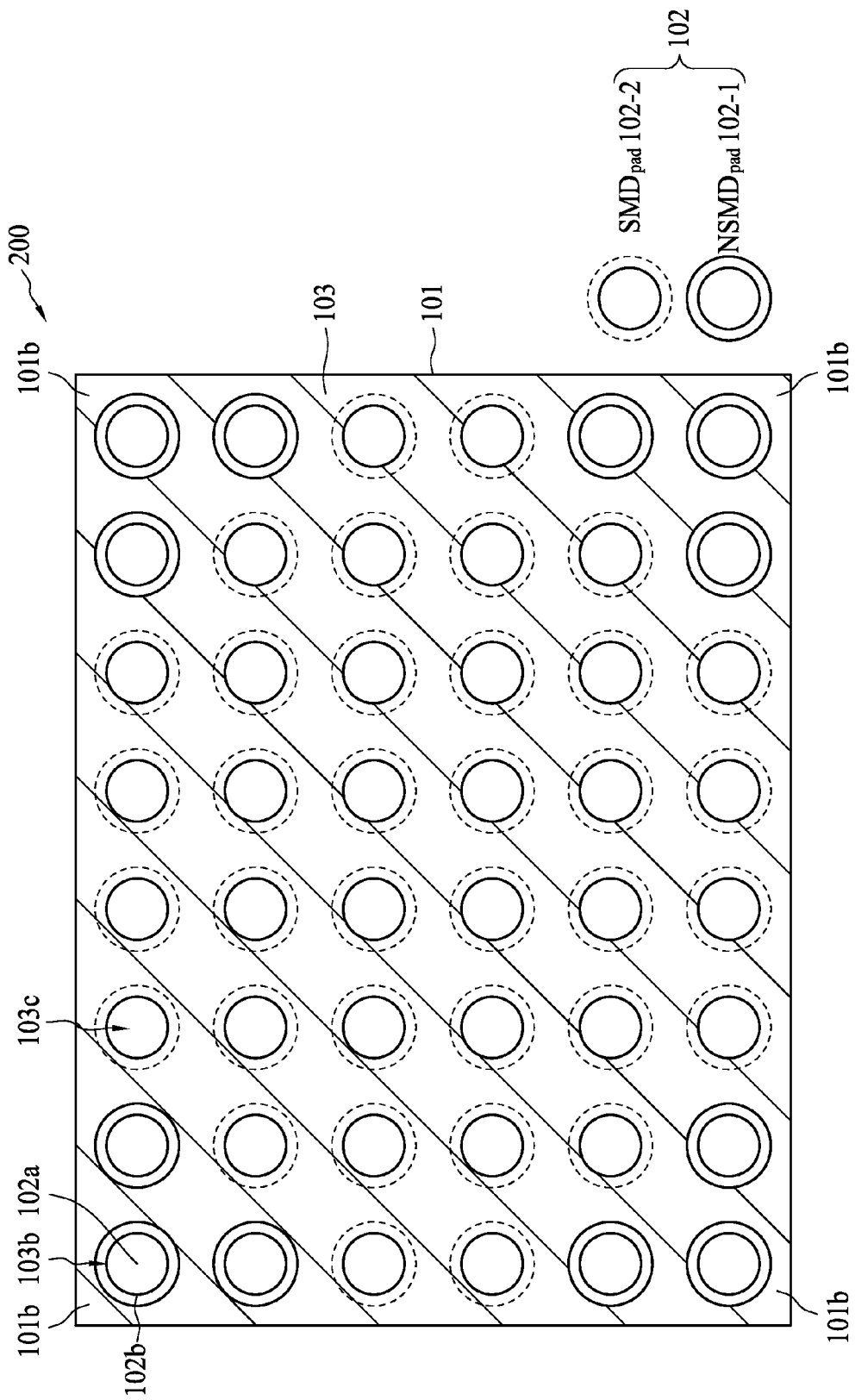
FIG. 4B is a top view of a semiconductor device with a NSMD pad adjacent to a corner in accordance with some embodiments of the present disclosure.

FIG. 4B is an embodiment of a semiconductor device 200. The semiconductor device 200 includes a substrate 101, a solder mask 103 on the substrate, several NSMD pads 102-1 and several SMD pads 102-2 disposed on the substrate 101. In some embodiments, the SMD pad 102-2 is disposed at a central portion of the substrate 101.

In some embodiments, the NSMD pad 102-1 is arranged at a predetermined location. In some embodiments, the predetermined location is at a corner 101b of the substrate 101 and at a corner region adjacent to the corner 101b. In some embodiments, the NSMD pad 102-1 neighboring with the NSMD pad 102-1 at the corner 101b. In some embodiments, there are three NSMD pads 102-1 are disposed at the corner 101b and the corner region.

In some embodiments, the solder mask 103 includes several first recessed portions 103b and several second recessed portions 103c. In some embodiments, the first recessed portion 103b is disposed at the predetermined location in accordance with a position of a corresponding NSMD pad 102-1. In some embodiments, the first recessed portion 103b is disposed at the corner 101b as well as the corner region. In some embodiments, there are three first recessed portions 103b disposed at the corner 101b and the corner region, corresponding to the positions of the corresponding NSMD pads 102-1.

Figure 4C:
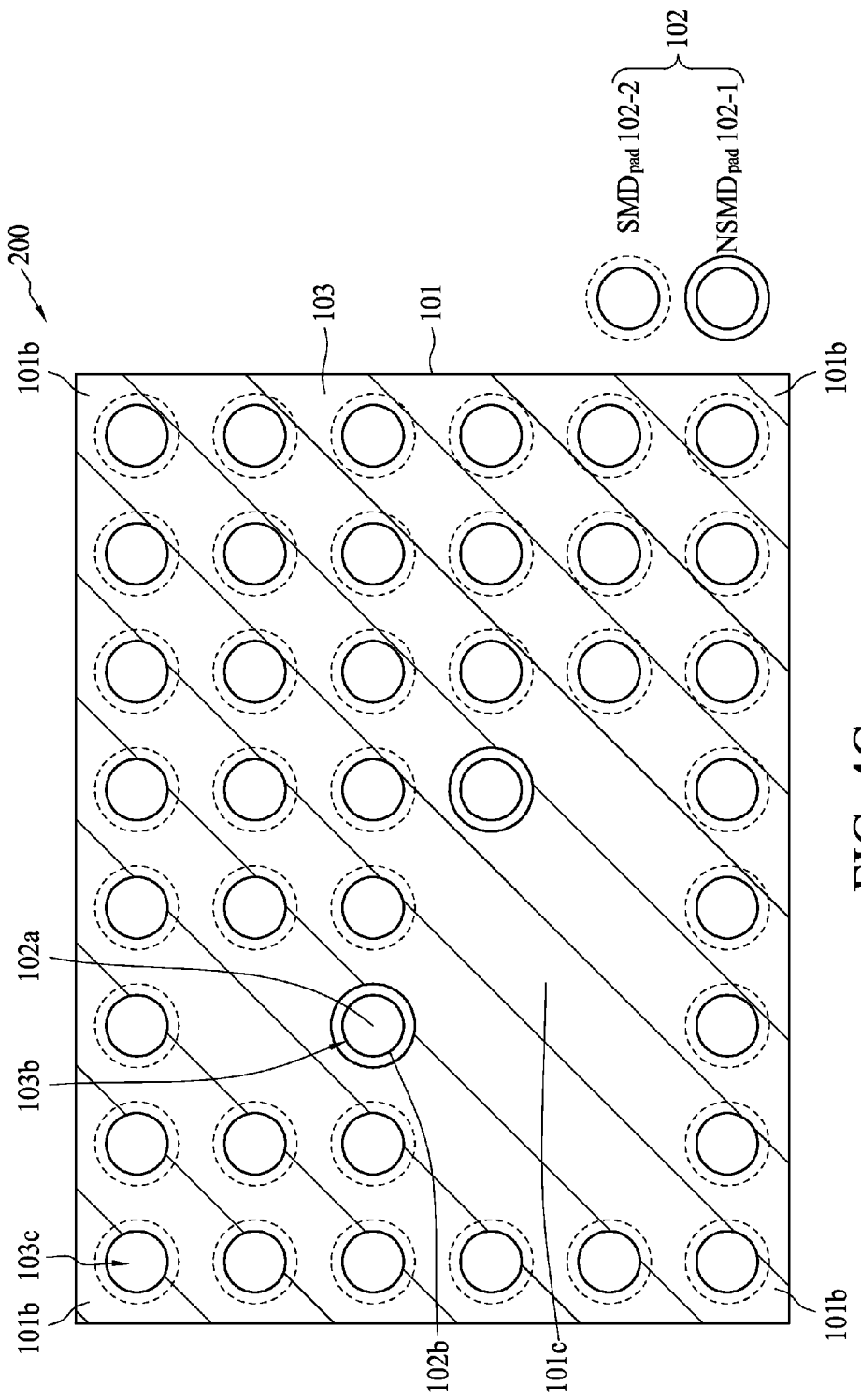
FIG. 4C is a top view of a semiconductor device with a NSMD pad adjacent to a void region in accordance with some embodiments of the present disclosure.

FIG. 4C is an embodiment of a semiconductor device 200. The semiconductor device 200 includes a substrate 101, a solder mask 103 on the substrate, several NSMD pads 102-1 and several SMD pads 102-2 disposed on the substrate 101. In some embodiments, the NSMD pads 102-1 and the SMD pads 101-2 are arranged in an irregular array including a void region 101c which is absent from the NSMD pad and the SMD pad.

In some embodiments, the NSMD pad 102-1 is arranged at a predetermined location. In some embodiments, the predetermined location is at a position adjacent to the void region 101c of the substrate 101. The pad 102 adjacent to the void region 101c is defined as an isolated pad and is disposed as a NSMD pad 102-1. The isolated pad is neighbored with less than four of the pads 102. In some embodiments, there are two isolated pads adjacent to the void region 101c and disposed as NSMD pads 102-1.

In some embodiments, the solder mask 103 includes several first recessed portions 103b and several second recessed portions 103c. In some embodiments, the first recessed portion 103b is disposed at the predetermined location in accordance with a position of a corresponding NSMD pad 102-1. In some embodiments, the first recessed portion 103b is disposed adjacent to the void region 101c. The first recessed portion 103b surrounds the isolate pad adjacent to the void region 101c. In some embodiments, there are two first recessed portions 103b disposed adjacent to the void region 101c, corresponding to the positions of the corresponding NSMD pads 102-1 defined as isolated pads.

In the present disclosure, a method of manufacturing a semiconductor device is also disclosed. In some embodiments, a semiconductor device is formed by a method 300. The method 300 includes a number of operations and the description and illustration are not deemed as a limitation as the sequence of the operations.

Figure 5:
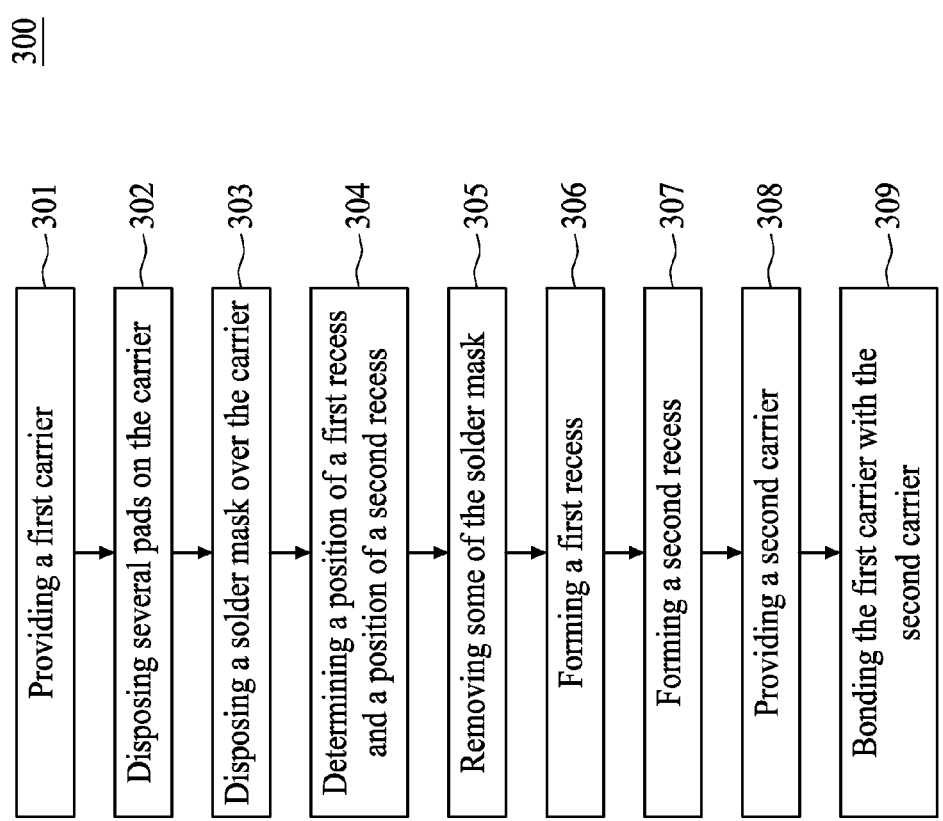
FIG. 5 is a flow diagram of a method of manufacturing a semiconductor device in accordance with some embodiments of the present disclosure.

FIG. 5 is an embodiment of a method 300 of manufacturing a semiconductor device. The method 300 includes a number of operations (301, 302, 303, 304, 305, 306, 307, 308, 309).

Figure 5A:
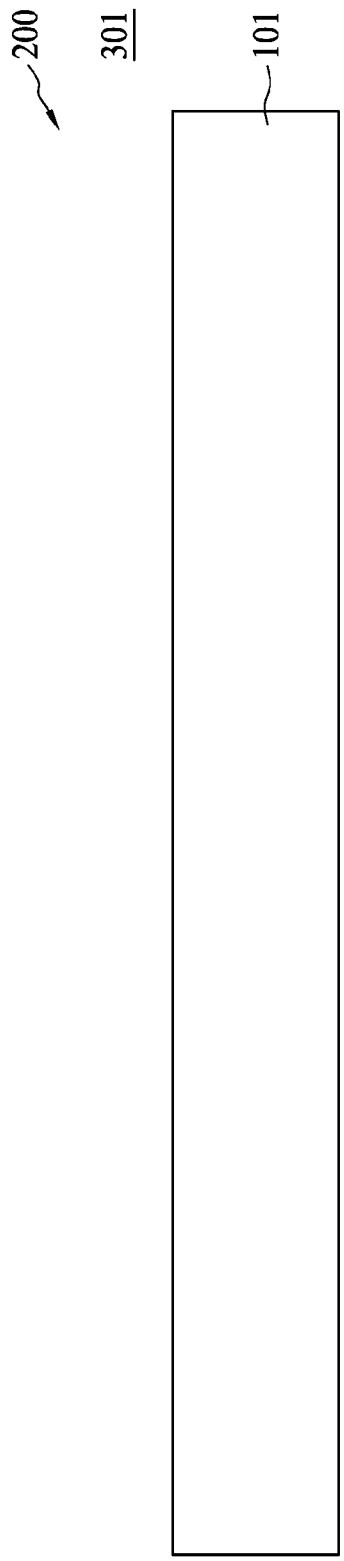
FIG. 5A is a schematic view of a semiconductor device with a first substrate in accordance with some embodiments of the present disclosure.

In operation 301, a first substrate 101 is provided as in FIG. 5A. In some embodiments, the first substrate 101 is a silicon substrate for supporting several semiconductor components and carrying a circuitry within the substrate. In some embodiments, the first substrate 101 is a printed circuit board (PCB).

Figure 5B:
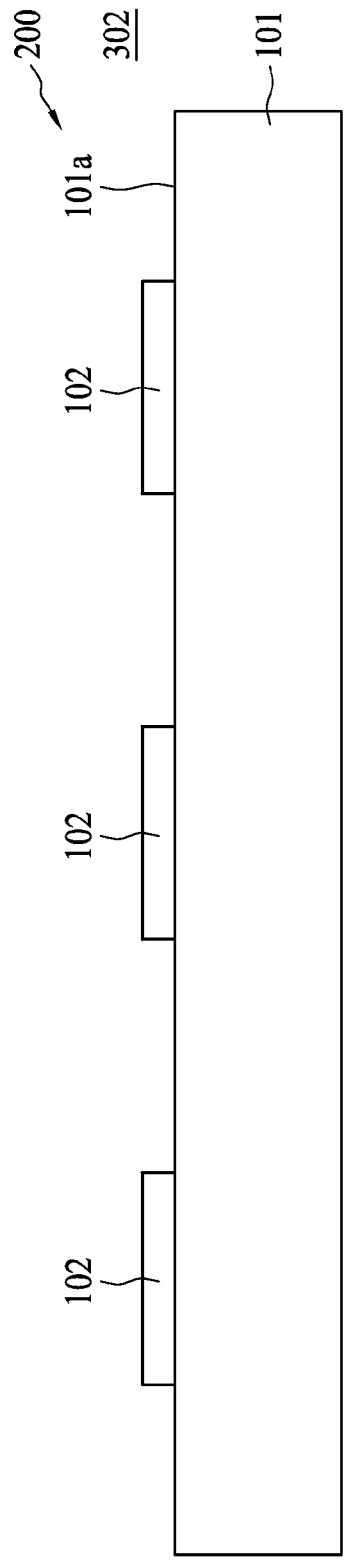
FIG. 5B is a schematic view of a semiconductor device with several pads in accordance with some embodiments of the present disclosure.

In operation 302, several pads 102 are disposed on a surface 101a of the substrate 101 as in FIG. 5B. In some embodiments, the pads 102 are disposed horizontally along the surface 101a. In some embodiments, the pad 102 is an under bump metallurgy (UBM) pad for receiving a bump. In some embodiments, the pads 102 are disposed on the surface 101a by electroplating. In some embodiments, the pad 102 includes a conductive material such as gold, silver, copper, nickel, tungsten, aluminum, and/or alloys thereof.

Figure 5C:
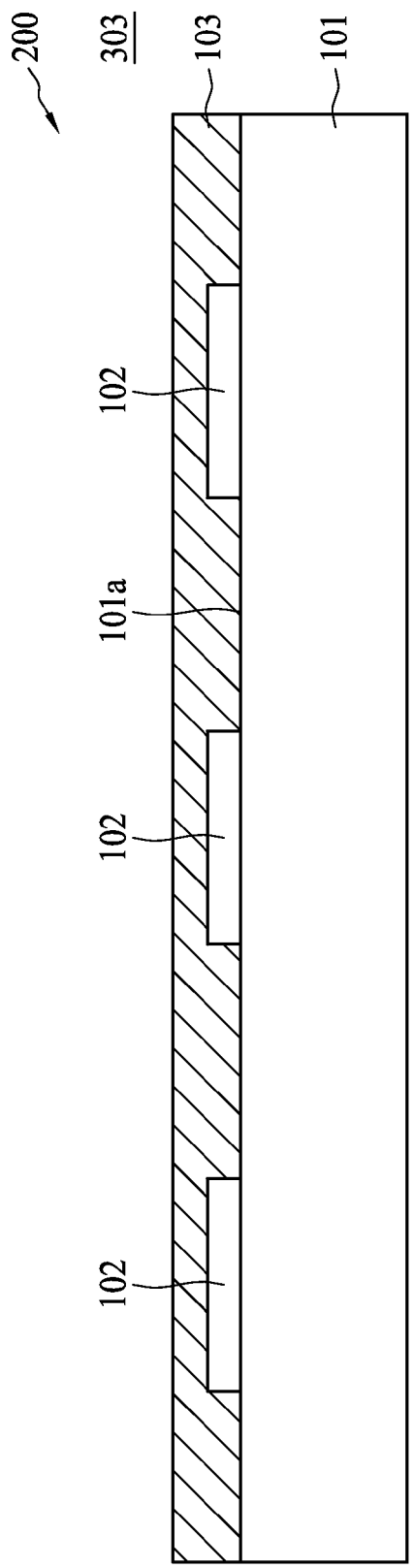
FIG. 5C is a schematic view of a semiconductor device with a solder mask in accordance with some embodiments of the present disclosure.

In operation 303, a solder mask 103 is disposed over the surface 101a of the substrate 101 as in FIG. 5C. The solder mask 103 covers the pads 102 and the surface 101a. In some embodiments, the solder mask 103 includes a polymeric material such as liquid epoxy, polyepoxide or etc. In some embodiments, the solder mask 103 is disposed on the surface 101a of the substrate 101 by silk screening, spraying, etc.

In operation 304, a position of a first recess and a position of a second recess on the solder mask are determined by various methods. In some embodiments, the position of the first recess and the position of the second recess are at predetermined positions.

Figure 5D:
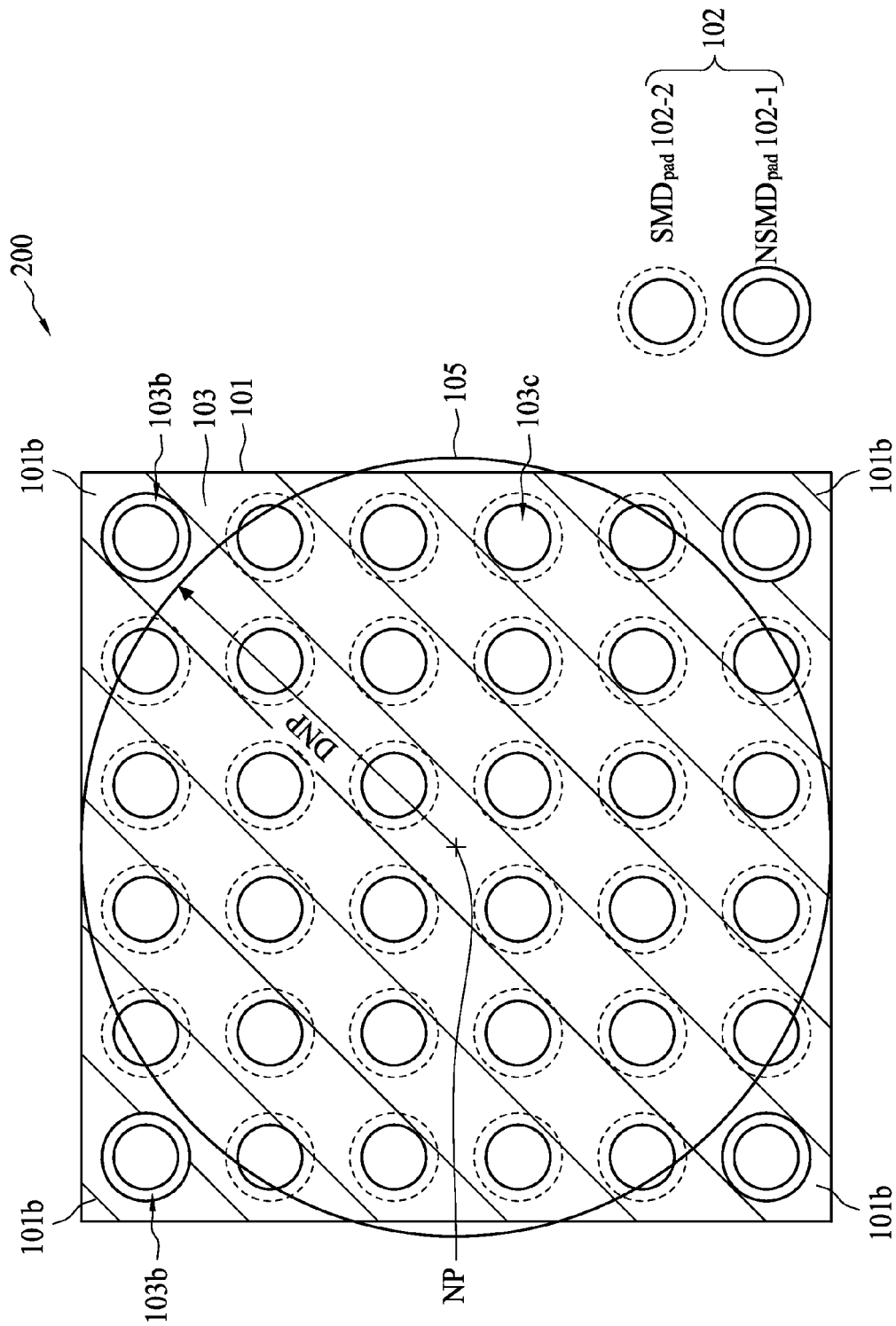
FIG. 5D is a top view of a semiconductor device with a NSMD pad at a corner in accordance with some embodiments of the present disclosure.

In some embodiments the positions are determined by a method as in FIG. 5D. FIG. 5D is a top view of the semiconductor device 200 as in FIGS. 5A, 5B and 5C. In some embodiments, the position of the first recess 103b and the position of the second recess 103c are determined by defining a circle 105 with a predetermined neutral point NP and a predetermined diameter DNP. In some embodiments, the circle 105 is centered at the neutral point NP and has a diameter DNP. The neutral point NP is a center of the circle 105.

In some embodiments, the position of the first recess 103b is determined at a position over the pad 102 outside the circle 105. In some embodiments, the pad 102 is disposed at a distance greater than a distance DNP between the neutral point NP and a circumference of the circle 105. In some embodiments, the position above the pad 102 outside the circle 105 is a corner 101b of the substrate 101. As such, the first recess 103b is determined at the corner 101b and over the pad 102. In some embodiments, there are four first recesses 103b disposed on the solder mask 103 and at the corner 101b.

In some embodiments, the position of the second recess 103c is determined at a position above the pad inside the circle 105. In some embodiments, the pad 102 is disposed at a distance less than a distance DNP between the neutral point NP and the circumference of the circle 105. In some embodiments, the position above the pad 102 inside the circle 105 is a central portion of the substrate 101, and thus the second recess 103b is determined at the central portion. In some embodiments, there are thirty two second recesses 103c disposed on the solder mask 103 and at the central portion of the substrate 101.

Figure 5E:
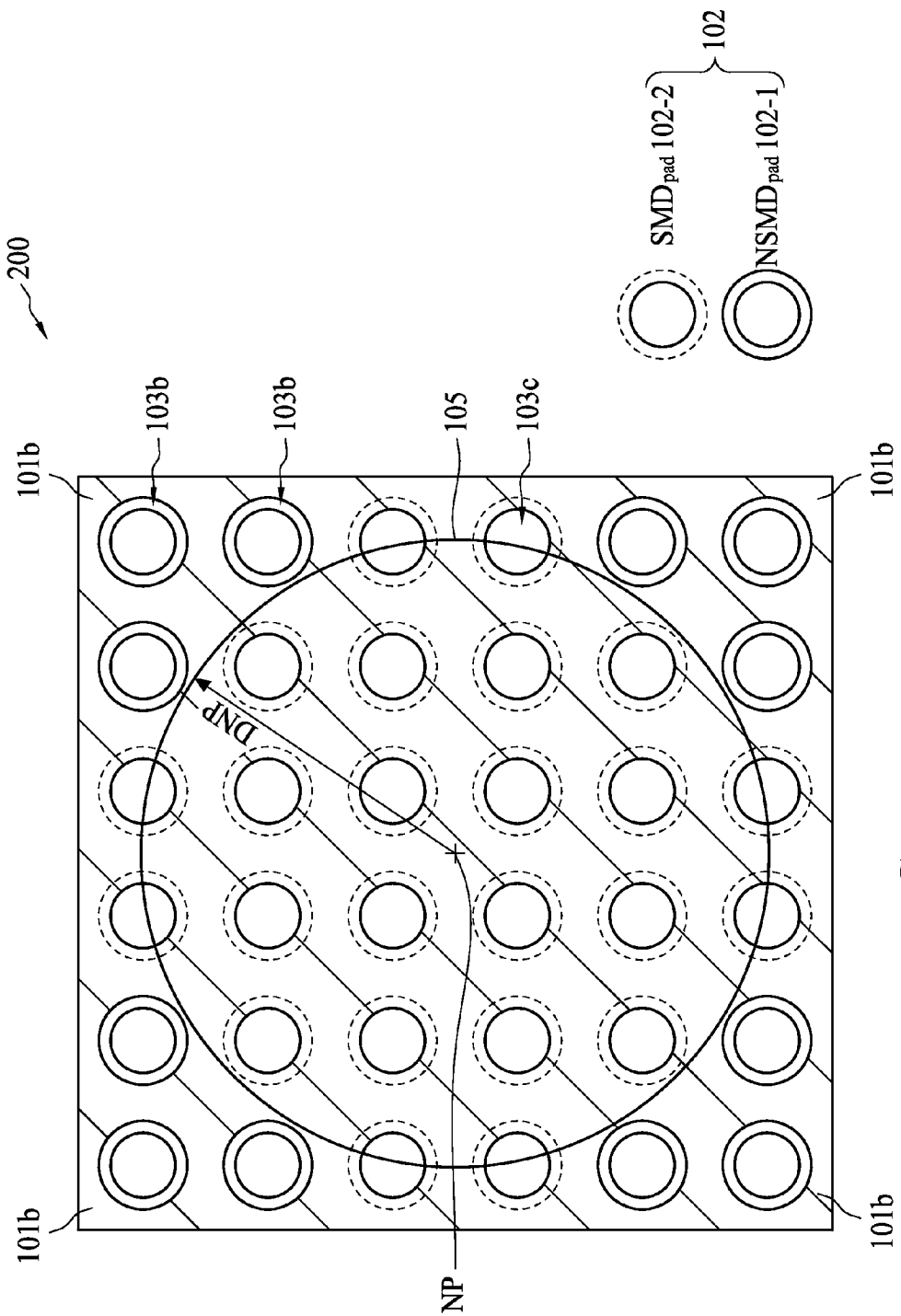
FIG. 5E is a top view of a semiconductor device with a NSMD pad adjacent to a corner in accordance with some embodiments of the present disclosure.

In some embodiments the positions of the first recess and second recess are determined by a method as in FIG. 5E. FIG. 5E is a top view of the semiconductor device 200 as in FIGS. 5A, 5B and 5C. In some embodiments, the position of the first recess 103b and the position of the second recess 103c are determined by defining a circle 105 with a predetermined neutral point NP and a predetermined diameter DNP. In some embodiments, the neutral point NP is a center of the circle 105.

In some embodiments, the position of the first recess 103b is determined at a position over the pad 102 outside the circle 105. In some embodiments, the pad 102 is disposed at a distance greater than a distance DNP between the neutral point NP and a circumference of the circle 105. In some embodiments, the position above the pad 102 outside the circle 105 is adjacent to a corner 101b of the substrate 101, and thus the first recess 103b is determined at the position adjacent to the corner 101b and over the pad 102. In some embodiments, there are twelve first recesses 103b disposed on the solder mask 103 over the pads 102 and at the position adjacent to the corner 101b.

In some embodiments, the position of the second recess 103c is determined at a position above the pad inside the circle 105. In some embodiments, the pad 102 is disposed at a distance less than a distance DNP between the neutral point NP and the circumference of the circle 105. In some embodiments, the position above the pad 102 inside the circle 105 is a central portion of the substrate 101, and thus the second recess 103c is determined at the central portion. In some embodiments, there are twenty four second recesses 103c disposed on the solder mask 103 above the pads 102 and at the central portion of the substrate 101.

Figure 5F:
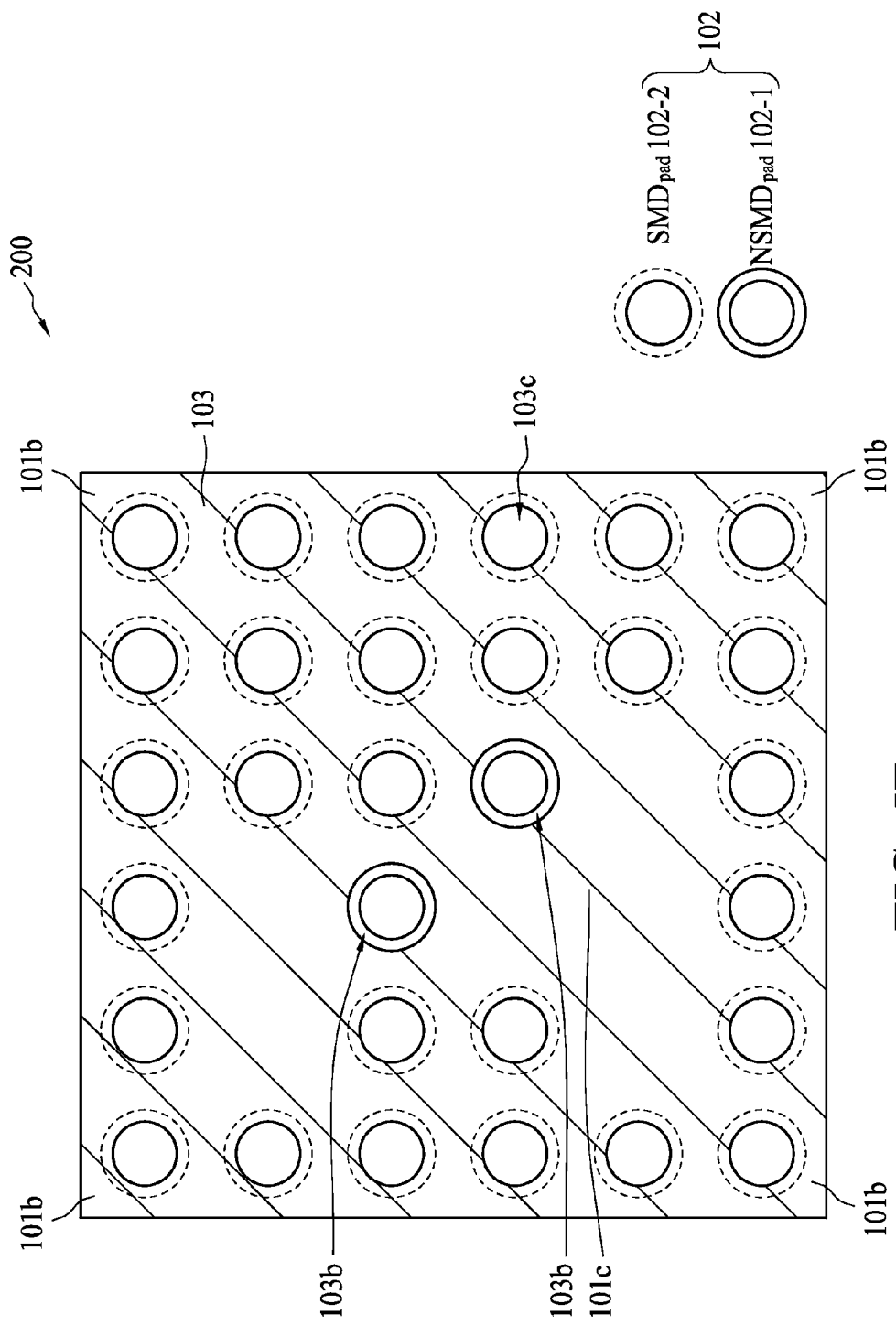
FIG. 5F is a top view of a semiconductor device with a NSMD pad adjacent to a corner in accordance with some embodiments of the present disclosure.

In some embodiments, the positions of the first recess and second recess are determined by a method as in FIG. 5F. FIG. 5F is a top view of the semiconductor device 200 as in FIGS. 5A, 5B and 5C. In some embodiments, the position of the first recess 103b and the position of the second recess 103c are determined according to a definition of a pad 102 as an isolated pad.

In some embodiments, the pad 102 is defined as the isolated pad if the pad 102 is adjacent to a void region 101c of the substrate 101. In some embodiments, the pad 102 is defined as the isolated pad if the pad 102 is neighbored with less than four of the pads 102. In some embodiments, there are two isolated pads adjacent to the void region 101c, and thus the first recess 103b is disposed above the isolated pad. In some embodiments, the second recess 103c is disposed above the pad 102 defined as non-isolated pad. The non-isolated pad is the pad 102 neighboring with more than four pads 102.

Figure 5G:
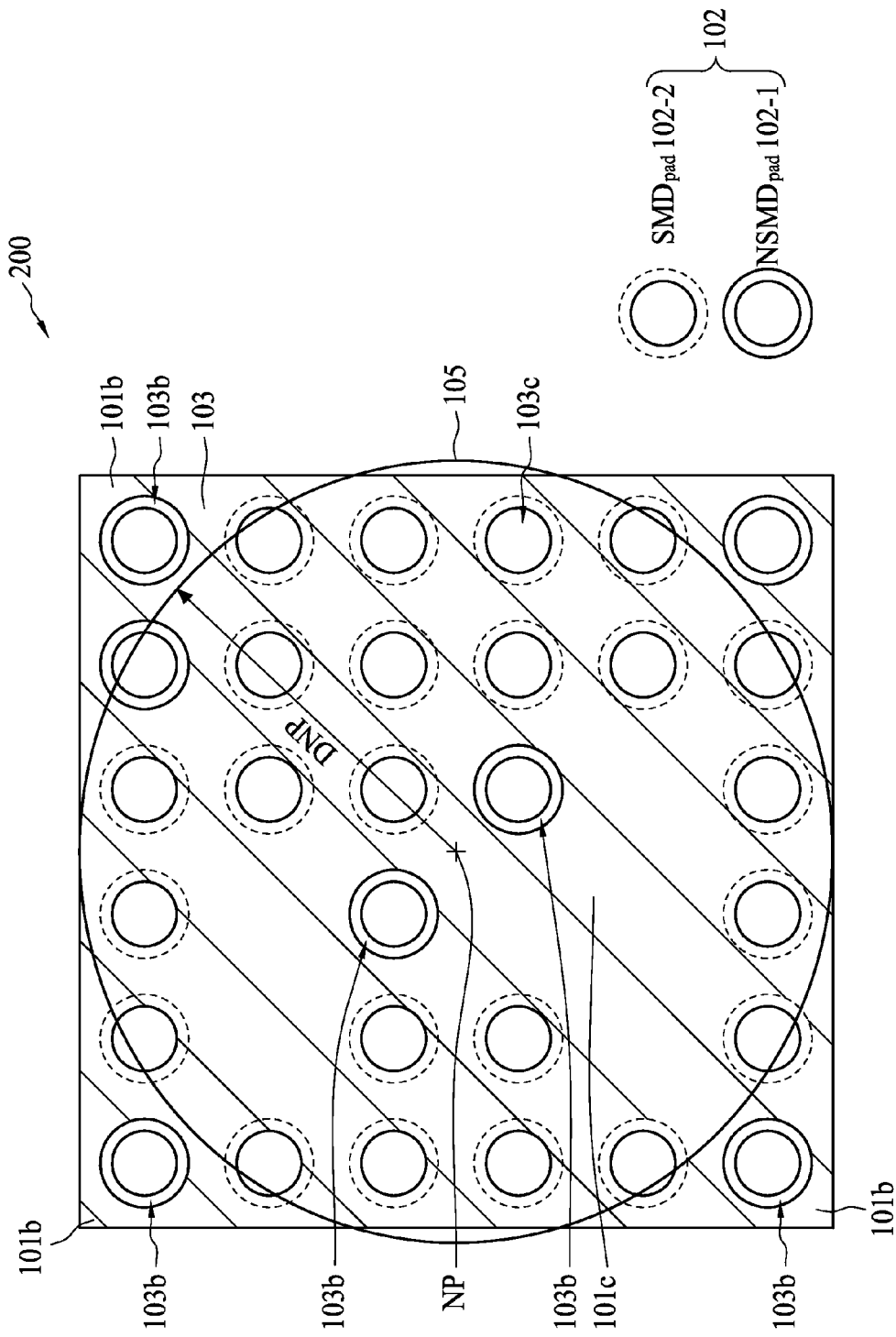
FIG. 5G is a top view of a semiconductor device with a NSMD pad outside a circle in accordance with some embodiments of the present disclosure.

In some embodiments the positions of the first recess and second recess are determined by combination of the methods of FIGS. 5D and 5F as a method in FIG. 5G. FIG. 5G is a top view of the semiconductor device 200 as in FIGS. 5A, 5B and 5C. In some embodiments, the position of the first recess 103b is determined by defining a pad 102 as an isolated pad as well as defining a circle 105 with a predetermined neutral point NP and a predetermined diameter DNP. The first recess 103b is disposed over the pad 102 as the isolated pad adjacent to a void region 101c or outside the circle 105, while the second recess 103c is disposed over the pad 102 as a non-isolated pad away from the void region 101c or inside the circle 105

Figure 5H:
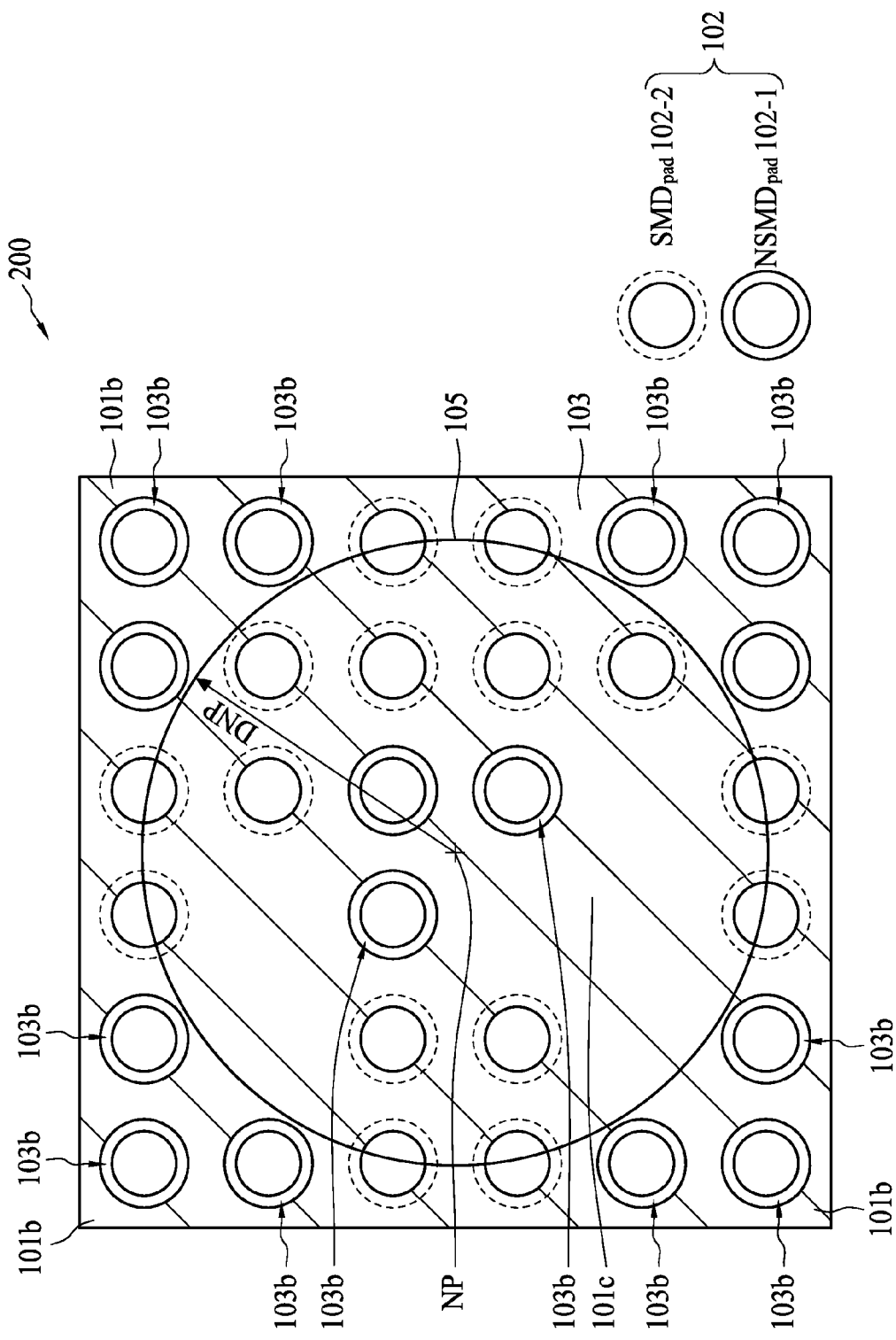
FIG. 5H is a top view of a semiconductor device with a NSMD pad outside a circle in accordance with some embodiments of the present disclosure.

In some embodiments the positions of the first recess and second recess are determined by combination of the methods of FIGS. 5E and 5F as a method in FIG. 5H. FIG. 5H is a top view of the semiconductor device 200 as in FIGS. 5A, 5B and 5C. In some embodiments, the position of the first recess 103b is determined by defining a pad 102 as an isolated pad as well as defining a circle 105 with a predetermined neutral point NP and a predetermined diameter DNP. The first recess 103b is disposed over the pad 102 as the isolated pad adjacent to a void region 101c or outside the circle 105, while the second recess 103c is disposed over the pad 102 as a non-isolated pad away from the void region 101c or inside the circle 105

Figure 5I:
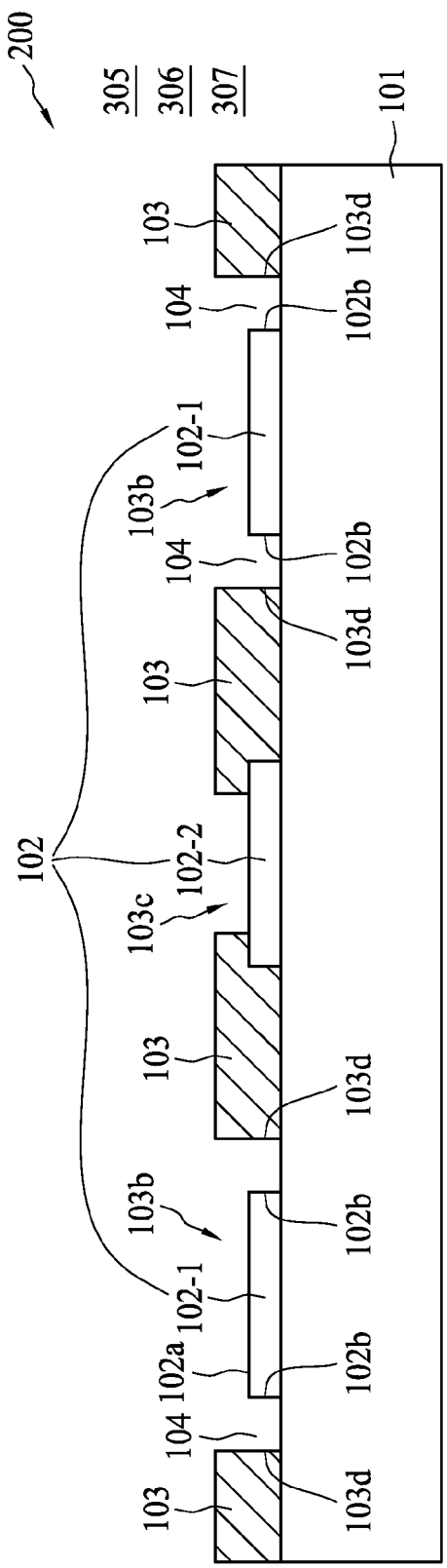
FIG. 5I is a schematic view of a semiconductor device with a NSMD pad and a SMD pad in accordance with some embodiments of the present disclosure.

In operation 305, a portion of the solder mask 103 is removed as in FIG. 5I. In some embodiments, a portion of the solder mask 103 is removed according to the determination of the positions of the first recess 103b and the second recess 103c over the pad 102, with reference to the operation 304 and FIG. 5D-5H as described above.

In operation 306, the first recess 103b of the solder mask 103 is formed as in FIG. 5I. In some embodiments, the first recess 103b is formed over the pad 102, so that the pad 102 becomes a non-solder mask defined (NSMD) pad 102-1. The NSMD pad 102-1 is in a configuration similar to FIGS. 1A and 1B. The NSMD pad 102-1 is correspondingly within the first recess 103b and is spaced away from the first recess 103b in a gap 104.

In operation 307, the second recess 103c of the solder mask 103 is formed as in FIG. 5I. In some embodiments, the second recess 103c is formed above the pad 102, so that the pad 102 becomes a solder mask defined (SMD) pad 102-2. The SMD pad 102-2 is in a configuration similar to FIGS. 1C and 1D. The SMD pad 102-2 is correspondingly above the second recess 103b and is partially covered by the solder mask 103.

Figure 5J:
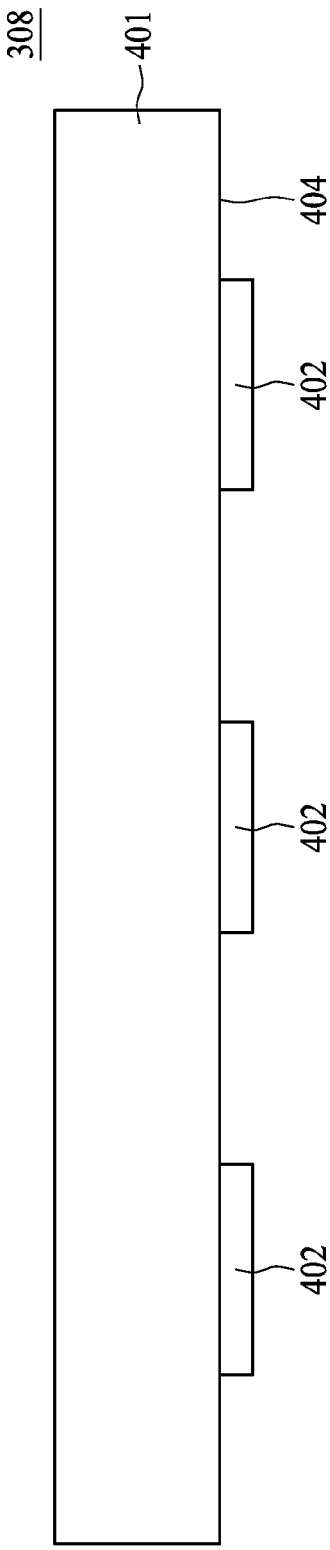
FIG. 5J is a schematic view of a semiconductor device with a second substrate in accordance with some embodiments of the present disclosure.
Figure 5K:
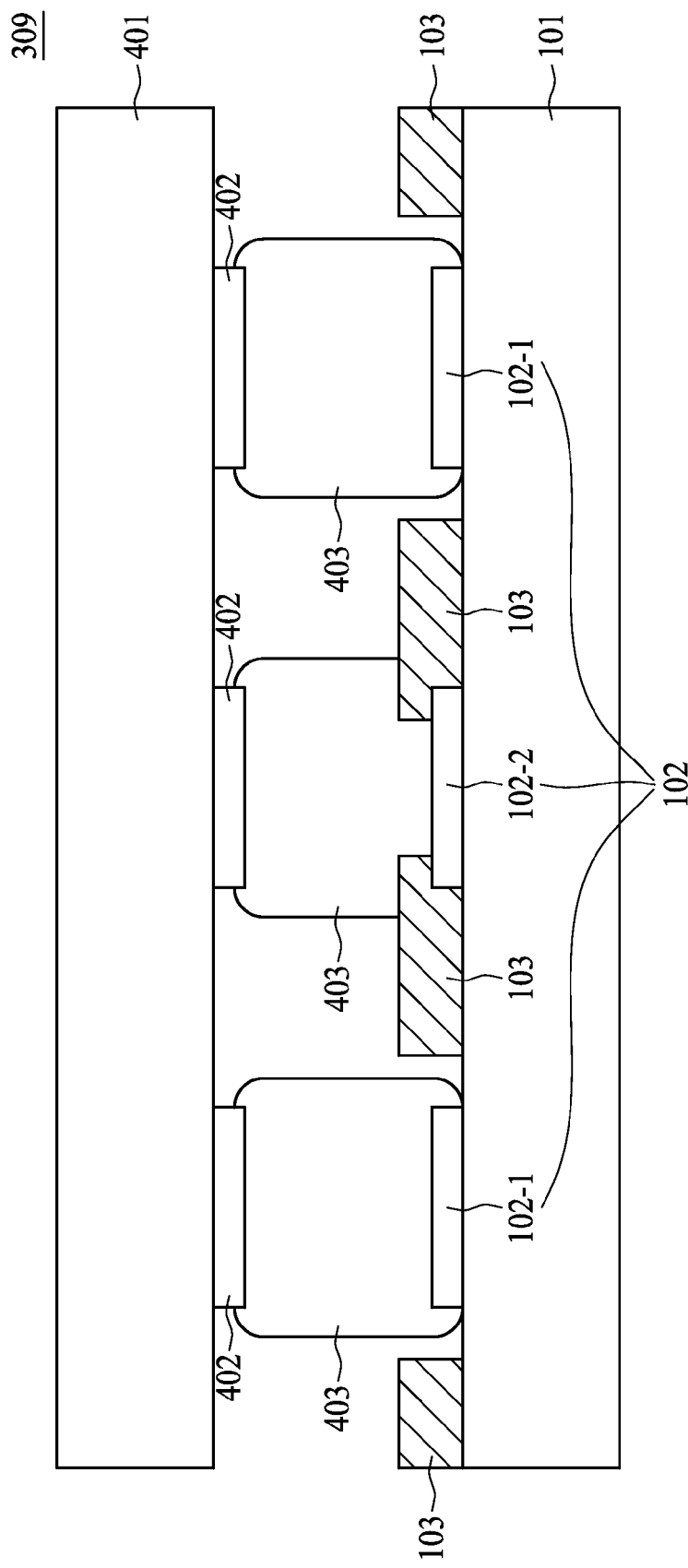
FIG. 5K is a schematic view of a semiconductor device with a first substrate and a second substrate in accordance with some embodiments of the present disclosure.

In operation 308, a second substrate 401 is provided as in FIG. 5J. In some embodiments, the second substrate 401 is a wafer substrate including a die and a circuitry within the wafer substrate. In some embodiments, several die pads 402 are disposed on a surface 404 of the second substrate 401. The die pad 402 is configured for receiving a bump.

In operation 309, the first substrate 101 is bonded with the second substrate 401. In some embodiments, the first substrate 101 bonds with the second substrate 401 by connecting the pads 102 of the first substrate 101 correspondingly with the die pads 402 of the second substrate 401 by several bumps 403. The bumps 403 are attached with the die pads 402 and the pads 102 correspondingly, so that the circuitry within the first substrate 101 is electrically connected to the circuitry within the second substrate 401 through the pads 102, the die pads 402 and the bumps 403.

In some embodiments, a semiconductor device includes a substrate including a surface, several pads disposing on the surface of the substrate, the pads includes a non-solder mask defined (NSMD) pad and a solder mask defined (SMD) pad, and the NSMD pad is arranged at a predetermined location.

In some embodiments, the predetermined location is at a corner of the substrate. In some embodiments, the SMD pad is disposed away from the corner of the substrate. In some embodiments, the NSMD pad and the SMD pad are arranged in an irregular array including a void region which is absent from the NSMD pad and the SMD pad, and the NSMD pad is arranged adjacent to the void region. In some embodiments, the SMD pad is partially covered by a solder mask. In some embodiments, the NSMD pad is spaced from a solder mask.

In some embodiments, a semiconductor device includes a substrate including a surface, several pads disposing on the surface of the substrate, a solder mask disposing over the surface of the substrate, the solder mask includes several first recessed portions and several second recessed portions, at least one of the pads is correspondingly within the first recessed portions, and at least one of pads is correspondingly disposed underneath the second recessed portions.

In some embodiments, each of the first recessed portions is larger than a corresponding one of the pads. In some embodiments, each of the second recessed portion is smaller than a corresponding one of the pads. In some embodiments, the first recessed portions are disposed at a corner of the substrate. In some embodiments, the second recessed portions are disposed at a central portion of the substrate.

In some embodiments, a method of manufacturing a semiconductor device includes providing a substrate, disposing several pads on a surface of the substrate, disposing a solder mask over the surface of the substrate and the pads, forming a first recess in the solder mask to surround one of the pads, and forming a second recess in the solder mask and above one of the pads.

In some embodiments, the first recess is formed when one of the pads corresponding to the first recess is disposed at a corner of the substrate. In some embodiments, the method further includes determining a position of the first recess and a position of the second recess being formed on the solder mask. In some embodiments, the method further includes defining a circle with a predetermined neutral point and a predetermined diameter to determine a position of the first recess and a position of the second recess on the solder mask.

In some embodiments, the first recess is positioned to surround one of the pads disposed outside a circle with a predetermined neutral point and a predetermined diameter. In some embodiments, the second recess is positioned above one of the pads disposed inside a circle with a predetermined neutral point and a predetermined diameter. In some embodiments, the method further includes defining at least one of the pads adjacent to a void region of the substrate as an isolated pad. In some embodiments, the first recess is formed to surround the pad defined as an isolated pad. In some embodiments, the pad defined as an isolated pad is neighbored with less than four pads.

The methods and features of this invention have been sufficiently described in the above examples and descriptions. It should be understood that any modifications or changes without departing from the spirit of the invention are intended to be covered in the protection scope of the invention.

Moreover, the scope of the present application in not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein maybe utilized according to the present disclosure.

Accordingly, the appended claims are intended to include within their scope such as processes, machines, manufacture, compositions of matter, means, methods or steps. In addition, each claim constitutes a separate embodiment, and the combination of various claims and embodiments are within the scope of the invention.

What is claimed is:
1. A semiconductor device, comprising:
a substrate including a surface, a first edge and a second edge orthogonal to the first edge;
a plurality of pads disposed on the surface of the substrate, wherein the plurality of pads are arranged in a regular array including a plurality of horizontal rows and a plurality of vertical columns, the plurality of the horizontal rows are separated from each other in a distance, the plurality of the vertical columns are separated from each other in the distance, the plurality of pads are separated from each other in the distance, the plurality of pads include a plurality of non-solder mask defined (NSMD) pads and a plurality of solder mask defined (SMD) pads, the plurality of horizontal rows include a first row nearest to the first edge and a second row nearest to the first row, the plurality of vertical columns include a first column nearest to the second edge and a second column nearest to the first column, all of the plurality of NSMD pads are disposed only at an end of the first row, an end of the second row, an end of the first column and an end of the second column.

2. The semiconductor device of claim 1, wherein the plurality of SMD pads are disposed away from a corner of the semiconductor device.

3. The semiconductor device of claim 1, wherein each of the plurality of SMD pads is partially covered by a solder mask.

4. The semiconductor device of claim 1, wherein each of the plurality of NSMD pads is spaced from a solder mask.

5. A semiconductor device, comprising:
a substrate including a surface;
a plurality of pads disposing on the surface of the substrate and including a plurality of non-solder mask defined (NSMD) pads and a plurality of solder mask defined (SMD) pads,
wherein the plurality of SMD pads are neighbored vertically or horizontally with each other in a first distance, and the plurality of pads are arranged in an irregular array thereby the substrate includes a void region absent from the plurality of pads, and each of the plurality of NSMD pads is disposed away from one of the plurality of SMD pads across the void region in a second distance greater than the first distance.

6. The semiconductor device of claim 5, wherein the second distance is at least two times of the first distance.

7. The semiconductor device of claim 5, wherein the plurality of NSMD pads are isolated pads and are arranged adjacent to the void region.

8. The semiconductor device of claim 7, wherein each of the isolated pads is neighbored with less than four of the plurality of SMD pads.

9. The semiconductor device of claim 5, wherein the void region includes a width and a length substantially greater than two times of the first distance respectively.

10. The semiconductor device of claim 5, wherein the plurality of NSMD pads are disposed at a central portion of the substrate.

11. The semiconductor device of claim 5, wherein the void region is disposed adjacent to a central portion of the substrate.

12. The semiconductor device of claim 5, wherein the plurality of NSMD pads are disposed at a corner of the substrate.

13. The semiconductor device of claim 5, wherein each of the plurality of NSMD pads is arranged at a predetermined location adjacent to the void region.

14. A method of manufacturing a semiconductor device, comprising:
   providing a substrate;
   disposing a plurality of pads on a surface of the substrate;
   disposing a solder mask over the surface of the substrate and the plurality of pads;
   defining a circle with a predetermined neutral point and a predetermined diameter to determine positions of a plurality of first recesses being formed on the solder mask;
   forming each of the plurality of first recesses in the solder mask to surround one of the plurality of pads; and
   forming each of a plurality of second recesses in the solder mask and above one of the plurality of pads.

15. The method of claim 14, wherein the plurality of first recesses are formed at corners of the substrate respectively.

16. The method of claim 14, wherein the plurality of first recesses are positioned to surround the plurality of pads disposed outside the circle.

17. The method of claim 14, wherein the plurality of second recesses are positioned above the plurality of pads disposed inside the circle.

18. The method of claim 14, further comprising defining at least one of the plurality of pads adjacent to a void region of the substrate as an isolated pad.

19. The method of claim 14, wherein the plurality of first recesses are formed to surround the plurality of pads defined as an isolated pad.

20. The method of claim 14, wherein the plurality of second recesses are disposed at a central portion of the substrate.

* * * * *